United States Patent
Ray et al.

(10) Patent No.: US 6,784,086 B2
(45) Date of Patent: Aug. 31, 2004

(54) LEAD-FREE SOLDER STRUCTURE AND METHOD FOR HIGH FATIGUE LIFE

(75) Inventors: Sudipta K. Ray, Wappingers Falls, NY (US); Amit K. Sarkhel, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 09/779,812

(22) Filed: Feb. 8, 2001

(65) Prior Publication Data

US 2002/0149113 A1 Oct. 17, 2002

(51) Int. Cl.$^7$ .............................................. H01L 21/44
(52) U.S. Cl. ..................... 438/612; 438/613; 438/615
(58) Field of Search ................................ 438/612–617; 251/737, 738, 762, 772

(56) References Cited

U.S. PATENT DOCUMENTS

| | | | |
|---|---|---|---|
| 2,105,405 A | 1/1938 | Chase | |
| 3,716,907 A | 2/1973 | Anderson | 29/470.9 |
| 4,778,733 A | 10/1988 | Lubrano et al. | 428/647 |
| 4,875,617 A | 10/1989 | Citowsky | 228/123 |
| 5,147,084 A | 9/1992 | Behun et al. | 228/56.3 |
| 5,221,038 A | 6/1993 | Melton et al. | 228/180 |
| 5,369,880 A | * 12/1994 | Gundotra et al. | |
| 5,527,628 A | 6/1996 | Anderson et al. | 428/647 |
| 5,598,033 A | * 1/1997 | Behlen et al. | |
| 6,033,488 A | 3/2000 | An et al. | |
| 6,077,477 A | 6/2000 | Sakai et al. | 420/560 |
| 6,133,633 A | 10/2000 | Berger et al. | |
| 6,179,935 B1 | 1/2001 | Yamashita et al. | |
| 6,224,690 B1 | 5/2001 | Andricacos | |
| 6,281,581 B1 * | 8/2001 | Desai et al. | |

FOREIGN PATENT DOCUMENTS

| | | |
|---|---|---|
| AU | 68124 | 7/1991 |
| EP | 0544915 | 6/1993 |
| EP | 0629464 | 12/1994 |
| GB | 131299 | 8/1919 |
| WO | 97/09455 | 3/1997 |

OTHER PUBLICATIONS

Brazing and Soldering Alloys, Mar. 1962, Semi Conductor Data, Semi–Alloys Inc., 5 pages.
YOR919950085, Kang et al., Flip Chip Interconnections Using Lead–Free Solders, 4 pages, 1996.
Hanson, M., Constitution of Binary Alloys, 1985, Genium Publishing Corporation, 4 pages, (p 1174–1177).
Bath, J. et al., Research Update: Lead–Free Solder Alternatives, vol. 11, No. 5, May 2000, Circuit Assembly, pp. 30–40.

* cited by examiner

*Primary Examiner*—Ha Tran Nguyen
(74) *Attorney, Agent, or Firm*—Schmeiser, Olsen & Watts; William H. Steinberg

(57) ABSTRACT

A method and structure for solderably coupling an electronic module (e.g. a ceramic or plastic ball grid array module) to a circuit board. A lead-free solder ball is soldered to the module without using a joining solder to effectuate the soldering. The solder ball comprises a tin-antimony alloy that includes about 3% to about 15% antimony by weight. The solder ball is soldered to the circuit board with a lead-free joiner solder. The joiner solder comprises a tin-silver-copper alloy that includes by weight about 95.5–96.0% tin, about 3.5–4.0% silver, and about 0.5–1.0% copper. The resultant solder connection between the module and the circuit board has a fatigue life of at least about 90% of a fatigue life of a reference structure. The reference structure has a 90Pb/10Sn solder ball joined to both the module and the circuit card by a 63Sn/37Pb joiner solder.

35 Claims, 3 Drawing Sheets

LEAD-FREE SOLDER STRUCTURE AND METHOD FOR HIGH FATIGUE LIFE

BACKGROUND OF THE INVENTION

1. Technical Field

The present invention relates to a method and structure for solderably coupling an electronic module (e.g. a ceramic or plastic ball grid array module) to a circuit board.

2. Related Art

An electronic module (e.g. a ceramic or plastic ball grid array module) is typically coupled to a circuit card by a lead-comprising solder interconnect. Unfortunately, lead is toxic and environmentally hazardous. Thus, there is a need for a lead-free solder interconnect structure for reliably coupling an electronic module to a circuit card.

SUMMARY OF THE INVENTION

The present invention provides a method for forming an electronic structure, comprising the steps of:

providing a substrate; and soldering a lead-free solder member to the substrate without using a joining solder to effectuate the soldering, wherein the solder member comprises a tin-antimony alloy that includes about 3% to about 15% antimony by weight.

The present invention provides a method for forming an electronic structure, comprising the steps of:

providing a first substrate and a second substrate;

soldering a lead-free solder member to the first substrate without using a joining solder to effectuate the soldering, wherein the solder member comprises a tin-antimony alloy that includes about 3% to about 15% antimony by weight; and soldering the solder member to the second substrate with a lead-free joiner solder.

The present invention provides an electronic structure, comprising:

a substrate;

a lead-free solder member soldered to the substrate with no joining solder between the solder member and the substrate, wherein the solder member comprises a tin-antimony alloy that includes about 3% to about 15% antimony by weight.

The present invention provides an electronic structure, comprising:

a first substrate;

a second substrate; and a lead-free solder member soldered to the first substrate with no joining solder between the solder member and the first substrate, wherein the solder member comprises a tin-antimony alloy that includes about 3% to about 15% antimony by weight, and wherein the solder member is soldered to the second substrate with a lead-free joiner solder.

The present invention provides a lead-free solder interconnect structure for reliably coupling an electronic module to a circuit card.

DETAILED DESCRIPTION OF THE INVENTION

Figure 1:
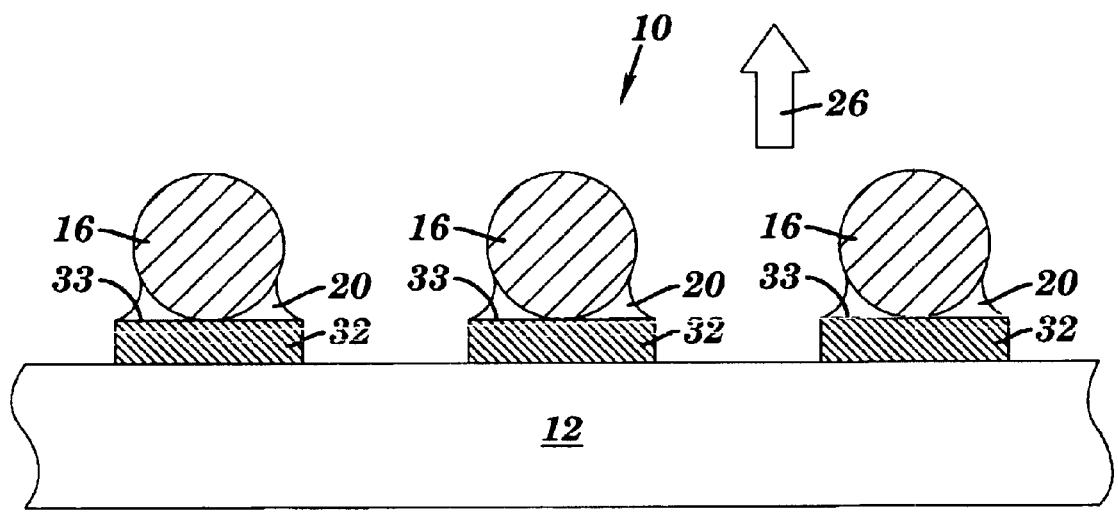
FIG. 1 depicts a front cross-sectional view of an electronic structure that includes a solder ball on an electronic module, in accordance with embodiments of the present invention.

FIG. 1 illustrates a front cross-sectional view of an electronic structure 10 that includes a lead-free solder ball 16 on an electronic module 12, in accordance with embodiments of the present invention. The electronic module 12 may include a chip carrier such as a ceramic ball grid array (CBGA) module or a plastic ball grid array (PBGA) module. The lead-free solder ball 16 comprises a tin-antimony (Sn/Sb) alloy that includes about 3% to about 15% antimony by weight. The solder ball 16 is soldered to the electronic module 12 at a conductive pad 32 which exists on the electronic module 12. The solder ball 16 is soldered to the electronic module 12 by reflowing the solder ball 16 at a reflow temperature that exceeds the liquidus temperature of the tin-antimony alloy in the solder ball 16. Reflowing the solder ball 16 may be accomplished by any method known to one of ordinary skill in the art, such as by heating in a reflow oven. The solder ball 16 has an initial height $H_0$ in a direction 26 prior to being soldered to the electronic module 12, and a reduced height $H_1$ (i.e., $H_1<H_0$) after being soldered to the electronic module 12, because solder ball 16 material spreads on the conductive pad 32 while the solder ball 16 is being reflowed.

Table 1 infra shows the liquidus temperature and solidus temperature of various tin-antimony alloys (i.e., Sn/Sb alloys). Definitionally, the solidus temperature of a solder is a temperature below which the solder is totally solid. The liquidus temperature of a solder is a temperature above which the solder is totally liquid. The solidus temperature of a solder is less than the liquidus temperature if the solder includes an alloy that melts over a finite temperature range. Referring to Table 1, the liquidus temperature of a tin-antimony alloy having 3%, 5%, 10%, or 15% antimony by weight is 238, 240, 246, or 280° C., respectively.

TABLE 1

Solidus Temperature ($T_S$) and Liquidus Temperature ($T_L$) of Solder Systems.

| Solder System (Reference) | % Composition By Weight | $T_S$ (° C.) | $T_L$ (° C.) |
|---|---|---|---|
| Sn/Sb (Hanson, M.., "Constitution of Binary Alloys, "Genium Publ., Schenectady, NY (1985)) | 97 Sn/3 Sb | 233 | 238 |
| | 95 Sn/5 Sb | 234 | 240 |
| | 90 Sn/10 Sb | 245 | 246 |
| | 85 Sn/15 Sb | 246 | 280 |
| Sn/Ag/Cu (Bath, J. et al., "Research Update: Lead-Free Solder Alternatives," Circuits Assembly, Vol. 11, No. 5, May 2000) | 95.5 Sn/3.8 Ag/ 0.7 Cu | 217 | 217 |
| | 95.8 Sn/3.5 Ag/ 0.7 Cu | 217 | 217 |
| | 95.5 Sn/4.0 Ag/ 0.5 Cu | 216–17 | 216–17 |
| | 95.5 Sn/3.9 Ag/ 0.6 Cu | | |
| | 95.5 Sn/3.6 Ag/ 0.9 Cu | | |

It should be noted that antimony trioxide is toxic. Thus, the presence of antimony in the tin-antimony alloy used in the solder ball 16 would be a health concern if antimony trioxide had a propensity to form in conjunction with fabricating the electronic structure 10. Nonetheless, antimony is not oxidized to form antimony trioxide at a temperature less than about 550° C. In a worst-case using a tin-antimony alloy having 15% antimony by weight, the temperature required to reflow the tin-antimony alloy in the solder ball 16 need not exceed 300° C. even if the reflow occurs at 20° C. above the liquidus temperature 280° C. Thus, the use of antimony in the tin-antimony alloy of the solder ball 16 poses essentially no risk of forming antimony trioxide during the soldering of the solder ball 16 to the electronic module 12.

Referring to FIG. 1, the solder ball 16 is soldered to the electronic module 12 without an intervening joining solder (e.g., solder paste) between the solder ball 16 and the electronic module 12. The soldering of the solder ball 16 to the electronic module 12 may be preceded by fluxing as is known to one of ordinary skill in the art. Fluxing removes surface oxides and surface contaminants from the surface 33 of the conductive pad 32 and prevents reoxidation of the surface 33 when the conductive pad 32 is heated prior to reflow. Thus, fluxing promotes wetting with the liquid solder ball 16 at the reflow temperature. See E. G., D. P. Seraphim et al., "Principles of Electronic Packaging," pages 591–594, McGraw-Hill, Inc., 1989, for a discussion of fluxing. FIG. 1 shows a liquid flux 20 in conjunction with the soldering of the solder ball 16 to the electronic module 12. Any suitable liquid flux 20 known to one of ordinary skill in the art may be used, including fluxes of low viscosity as well as pasty, high-viscosity fluxes and semi-solid fluxes. As a result of the aforementioned soldering, the solder ball 16 is shown in FIG. 2 as being soldered to the electronic module 12.

Figure 2:
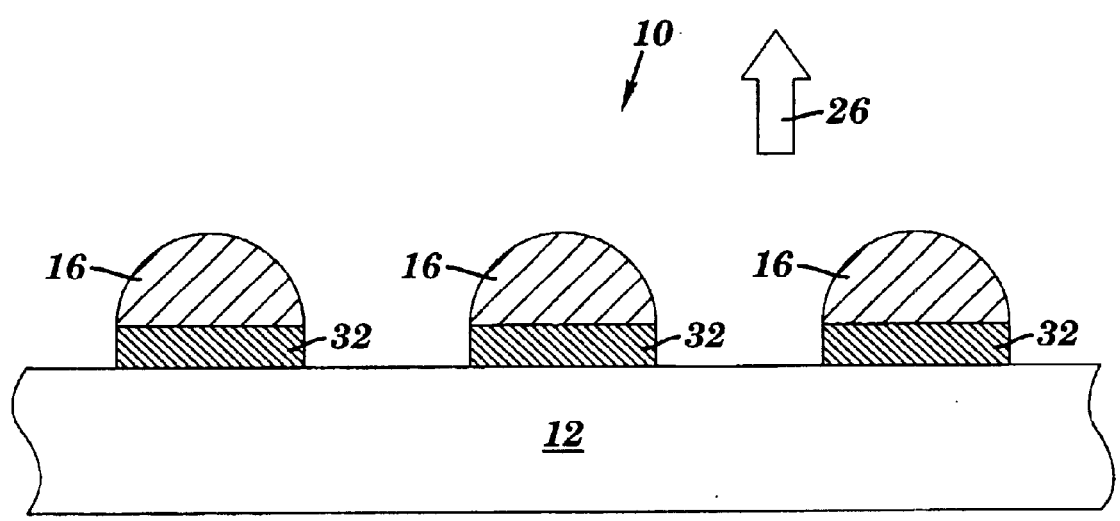
FIG. 2 depicts FIG. 1 after the solder ball has been soldered to the electronic module.

Melting and soldering the solder ball 16 of FIG. 1 to generate the structure of FIG. 2 causes solder of the solder ball 16 to spread on the conductive pad 32 and, as explained supra, the initial height $H_0$ of the solder ball 16 is reduced to a lesser height $H_1$ as a result of being reflowed. For example, an initially 35 mil diameter spherical solder ball 16 of FIG. 1 (i.e., $H_0$=35 mils), upon being soldered, takes the shape of a truncated sphere (as depicted in solder bump shape of the solder ball 16 of FIG. 2) having the reduced height $H_1$. $H_1$, which has been measured to be about 25.5 mils for particular cases in which $H_0$=35 mils, is generally a design parameter that depends on the initial diameter of the spherical solder ball 16 and the surface area of the conductive pad 32. A reduction in height from 35 mils to 25.5 mils is about a 27% height reduction from $H_0$ to $H_1$. A representative height reduction from $H_0$ to $H_1$ is in a range of about 25% –30%.

The present invention method of soldering the solder ball 16 to the electronic module 12 without using an intervening joining solder is a departure from a related art method used for a CBGA module. If the related method were used, the 35 mil diameter spherical solder ball 16 would be coupled to the CBGA module by reflowing a lower-melting joining solder disposed on the conductive pad 32. With the related art method, the lower-melting joining solder would be reflowed at a temperature such that the solder ball 16 would not melt, and the height of the resulting solder bump associated with the solder ball 16 (after the solder ball 16 has been soldered to the CBGA module) would remain at the initial 35 mil height (i.e., $H_1$=$H_0$ with the related art method). Although the related art method has the advantage that the solder bump height $H_1$ is higher than with the method of the present invention, the method of the present invention has the advantage of being less complicated.

Figure 3:
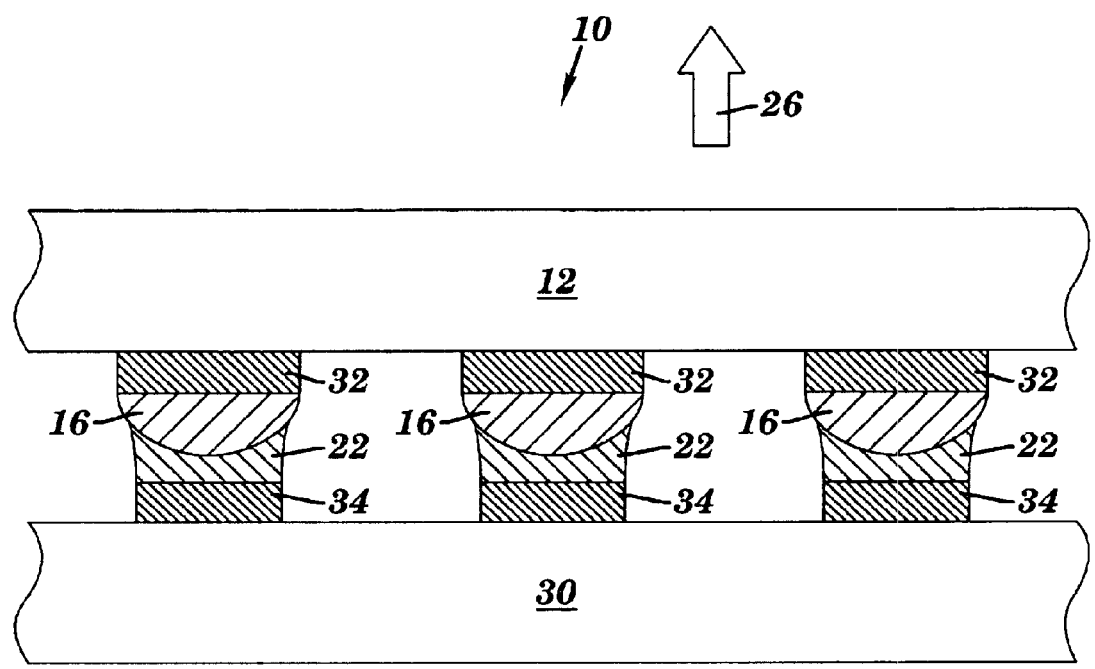
FIG. 3 depicts FIG. 2 after the electronic module has been coupled to a circuit card by soldering the solder ball to the circuit card using a joiner solder.

FIG. 3 illustrates FIG. 2 after the electronic module 12 has been coupled to a circuit card 30 by soldering the solder ball 16 to the circuit card 30, at the conductive pad 34 on the circuit card 30, by using (i.e., reflowing) a lead-free joiner solder 22. The joiner solder 22 may include any lead-free solder. Additionally, tests (to be described infra) demonstrate use of the joiner solder 22 containing 95.5Sn/3.8Ag/0.7Cu (i.e., 95.5% tin (Sn), 3.8% silver (Ag), and 0.7% copper (Cu), by weight). Accordingly, a useful class of alloys for inclusion in the joiner solder 22 is a tin-silver-copper alloy is shown in Table 1; i.e., a tin-silver-copper alloy that includes by weight about 95.5–96.0% tin, about 3.5–4.0% silver, and about 0.5–1.0% copper. Table 1 shows the solidus and liquidus temperatures for particular tin-silver-copper alloys, and demonstrates a liquidus temperature of about 217° C. for all tin-silver-copper alloys so listed.

Reflowing the joiner solder 22 to solder the solder ball 16 to the circuit card 30 may be accomplished at a reflow temperature ($T_{REFLOW}$) of greater than the liquidus temperature ($T_{L,JOINER}$) of the joiner solder 22; i.e., $T_{REFLOW}$>$T_{L,JOINER}$. To insure against uncertainties and nonuniformities in the spatial distribution of reflow temperature and to account for spatial inhomogeneities in the joiner solder 22, a temperature margin $\Delta T$ may be conservatively chosen for the reflow temperature $T_{REFLOW}$; i.e., $T_{REFLOW}$=$T_{L,JOINER}$+$\Delta T$. While any $\Delta T$ may be chosen, a $\Delta T$ of 10 to 25° C. is a representative range. Any desired margin $\Delta T$ is within the scope of the present invention. For the particular tin-silver-copper alloy class mentioned supra, Table 1 shows that $T_{L,JOINER}$ is about 217° C. Accordingly for the aforementioned tin-silver-copper alloy class, $T_{REFLOW}$ may be as low as just above 217° C., but may be conservatively chosen to be at least about 230° C., 235° C., etc.

Selection of the reflow temperature $T_{REFLOW}$ may take into account melt properties of the solder ball 16, since if $T_{REFLOW}$ is below the solidus temperature $T_{S,BALL}$ of the solder ball 16, then the solder ball 16 will not melt during reflow of the joiner solder 22. If the solder ball 16 melts during reflow of the joiner solder 22, then the melting of the solder ball 16 during the reflow of the joiner solder 22 will result in the solder ball 16 having a further reduction ($\Delta H_1$) of its height $H_1$ in the direction 26 between the electronic module 12 and the circuit card 30 following the reflow of the joiner solder 22. This further reduction $\Delta H_1$ of height is caused by the weight of the electronic module 12 acting upon the melted solder ball 16. In summary, the final height H of the solder ball 16 after being solderably attached to the circuit card 30 is $H_1$–$\Delta H_1$, wherein $\Delta H_1$=0 if $T_{REFLOW}$<$T_{S,BALL}$, and wherein $\Delta H_1$>0 if $T_{REFLOW} \geq T_{S,BALL}$.

Any reduction of height of the solder ball 16 (e.g., $H_0$–$H_1$, $\Delta H_1$, or $H_0$–$H_1$+$\Delta H_1$) relative to its initial height $H_0$ increases shear strain on the solder ball 16 during thermal transients such as during thermal testing or during field operation. The shear strain, which is proportional to 1/H, is a consequence of a mismatch in coefficient of thermal expansion (CTE) between the electronic module 12 and the circuit card 30. For example, the circuit card 30 may have a CTE in a range of approximately 14 to 22 ppm/° C., while the electronic module 12 that includes a ceramic chip carrier may have a CTE in a range of approximately 6 to 11 ppm/° C. The electronic module 12 that includes an organic chip carrier may have a CTE in a range of approximately 6 to 24 ppm/° C. As the shear strain increases, the thermal fatigue life (TFL) of the attachment of the solder ball 16 to the conductive pad 34 decreases. TFL is proportional to (1/shear strain)$^2$, or equivalently, TFL is proportional to $H^2$. Consequently, if the solder ball 16 does not melt during reflow of the joiner solder 22, then the TFL is potentially greater than if the solder ball 16 melts during reflow of the joiner solder 22. It is noted that even if the solder ball 16 melts during reflow of the joiner solder 22, $\Delta H_1$ is generally less than $H_0-H_1$. For example, if $H_0=35$ mils, then $H_1$ is about 25.5 mils, and $\Delta H_1$ is of the order of 2.0 mils to 3.5 mils depending on the weight of the electronic module 12 (based on cross sectional measurements associated with use of the 1.5 mm and 2.9 mm CBGA module thickness of Table 2 infra, respectively). Thus, it may be desirable to limit the reflow temperature to below the solidus temperature of the solder ball 16. Additionally, a sufficiently high temperature may cause damage to a portion of the electronic structure 10, such as to an electronic device or component of the circuit card 30. Thus, the reflow temperature may be kept below a highest temperature which will not damage any portion of the electronic structure 10. Said highest temperature which will not damage any portion of the electronic structure 10 is case-dependent and may be, inter alia, about 250° C. Thus, a useful range of reflow temperature may include, inter alia, about 230° C. to about 250° C.

Table 1 shows that within the range of 3 to 15% antimony, by weight, for the tin-antimony (Sn/Sb) alloy, $T_{S,BALL}$ is within a range of 233–246° C. Thus, the solder ball 16 will not melt during reflow of the joiner solder 22 if $T_{REFLOW}$ is below 233, 234, 245, or 246° C. for an antimony weight percent of 3%, 5%, 10%, or 15%, respectively, in the tin-antimony alloy. It is noted that 10% antimony has a value of $T_{S,BALL}$ (245° C.) that is only 1° C. lower than the value of 246° C. of $T_{S,BALL}$ for 15% antimony. Nonetheless, structural properties (e.g., brittleness) become more favorable as the Sn/Sb Ratio increases (i.e., as the antimony weight percent decreases). Thus, it may be more desirable to use 10% antimony than 15% antimony in the tin-antimony alloy of the solder ball 16. As a result, a desirable range of antimony weight percent in the tin-antimony alloy of the may be about 5 to 10%, or about 3 to 10%.

Table 2 infra lists the results of TFL testing of various solder melt structures. The testing ascertained the TFL of an electronic structure which resembles the electronic structure 10 of FIG. 3, with various embodiments of the material of the solder ball 16 and of the material of the joiner solder 22, as shown in Cases #1, #2, #3, and #4. Cases #1 and #2 involve lead-comprising solders and are thus not within the scope of the present invention. Case #1 was utilized as a reference case against which cases #2, #3, and #4 were compared with respect to TFL. Case #2 was used only for comparison with cases #1, #3, and #4 as to TFL. The circuit card 30 held six electronic modules 12. Each of the six electronic modules 12 included a ceramic ball grid array (CBGA) module having an array of 25×25 solder ball 16 joints with joiner solder 22 (i.e., solder paste) at corresponding 25×25 conductive pads 34 on the circuit card 30. Thus, the total number of solder joints on the circuit card 30 was 3750 (i.e., 6×25×25). Two thicknesses of CBGA modules were tested, namely 1.5 mm and 2.9 mm.

For all of the tests listed in Table 2, the solder ball 16 had a 35 mil thickness prior to being soldered to the electronic module 12 (i.e., $H_0=35$ mils for all tests). For Case #1, the solder ball 16 remained spherical with retention of its 35 mil diameter after being soldered with solder paste to the electronic module 12 without being melted, and also after being coupled to the circuit card 30 with the 63Sn/37Pb solder paste (i.e., $H=H_1=H_0$). Cases #2, #3, and #4 each involved melting the solder ball 16 during soldering the solder ball 16 to the electronic module 12 such that $H_1 \approx 25.5$ mils. Also in Cases #2, #3, and #4, the solder ball 16 melted during soldering the solder ball 16 to the circuit card 30 such that $\Delta H_1 \approx 2.0$ mils when the 1.5 mm thick CBGA module was used, and $\Delta H_1 \approx 3.5$ mils when the 2.9 mm thick CBGA module was used.

TABLE 2

Thermal Fatigue Life (TFL) Testing of Solder Melt Structures

| | Normalized Thermal Fatigue Life | | | |
|---|---|---|---|---|
| Ceramic Electronic Module Thickness (mm) | Case #1 Dual-Melt; 90 Pb/10 Sn solder ball 16; 63 Sn/37 Pb joiner solder 22; $<T_{PK}> = 215°$ C. | Case #2 Single-Melt; 63 Sn/37 Pb solder ball 16 and joiner solder 22; $<T_{PK}> = 215°$ C. | Case #3 Single-Melt; 95.5 Sn/3.8 Ag/.7 Cu solder ball 16 and joiner solder 22; $<T_{PK}> = 240°$ C. | Case #4 Dual-Melt; 95 Sn/5 Sb solder ball 16; 95.5 Sn/3.8 Ag/0.7 Cu joiner solder 22; $<T_{PK}> = 240°$ C. |
| 1.5 | 1.00 | 0.38 | 0.76 | 0.90 |
| 2.9 | 1.00 | 0.35 | 0.69 | 0.93 |

The testing, which is summarized in Table 2, included continuous thermal cycling with each thermal cycle having a duration of 30 minutes of: a transitioning from 0° C. to 100° C. in 15 minutes; and a transitioning from 100° C. to 0° C. in 15 minutes. The transitioning from 0° C. to 100° C. included 12½ minutes from 0° C. to nearly 100° C., followed by 2/2 minutes of an asymptotic or slow approach to 100° C. The transitioning from 100° C. to 0° C. included 12½ minutes from 100° C. to nearly 0° C., followed by 2½ minutes of an asymptotic or slow approach to 0° C.

The test started with 3 circuit cards and 6 modules per circuit card for a total of 18 modules for each of Cases #1, #2, #3, and #4. For any given Case (i.e., #1, #2, #3, or #4), each test cycle of 30 minutes subjected all 18 modules to the thermal cycling between 0 to 100° C. or 100 to 0° C. as described supra. Each module had 625 solder joints distributed in rings from a radial center ("neutral point") such that the solder joints in each ring were located at about a same distance from the neutral point ("DNP"). The solder joints in each ring were connected together in a stitch pattern. Two-point electrical resistance measurements were performed for each of the outermost 7 rings, initially and after each 100, 200, or 300 cycles. A module was considered to have failed if at least one ring in the module had a measured increase of at least 100 ohms in electrical resistance. After each resistance measurement, the failure probability was calculated as $N_{FAILED}/N_{TOTAL}$, where $N_{TOTAL}$ is the total number of modules tested (i.e., 18) and $N_{FAILED}$ is the number of modules that failed as determined by the resistance measurements. Then $N_{FAILED}/N_{TOTAL}$ versus $\log_{10} N_{CYCLES}$ was plotted and/or tabulated to generate a "failure curve" where $N_{CYCLES}$ is the number of cycles at which the last resistance measurements were made. Modeling the failure curve (i.e., $N_{FAILED}/N_{TOTAL}$ versus $\log_{10} N_{CYCLES}$) as a log-normal distribution, a calculation of N50 was made, where N50 is the number of cycles at which 50% or more modules have failed. In that manner, N50 was statistically derived from the failure curve. In the analysis based on Table 2, N50 was used as a measure of TFL. Note that TFL in Table 2 is expressed in normalized form such that TFL is taken as 1.0 for Case #1. Thus Case #1 serves as a reference against which TFL of Cases #2, #3, and #4 are compared.

In Table 2, Case #1 uses a high-melt 90Pb/10Sn alloy having a melting point of about 310° C. in the solder ball 16, and a low-melt eutectic 63Sn/37Pb alloy having a melting point of about 183° C. in the joiner solder 22. Thus, there is a very wide temperature window for selecting a reflow temperature for reflowing the joiner solder 22 without melting the solder ball 16. Accordingly, Case #1 has an acceptable thermal fatigue life ($TFL_1$) and has been normalized to 1.0 in order to serve as a reference case against which Cases #2, #3, and #4 may be compared. Case #1 exemplifies a dual-melt case in that the solder ball 16 and the joiner solder 22 melt at different temperatures. The average peak reflow temperature ($<T_{PK}>$) was 215° C. for Cases #1 and #2, and 240° C. for Cases #3 and #4. Thus based on the solidus and liquidus temperatures in Table 1, the solder ball 16 melted during reflow of the joiner solder 22 for Cases #2, #3, and #4. Accordingly, the reflow of the joiner solder 22 resulted in reducing the height of the solder ball 16 from 25.5 mils to about 22 mils for the 2.9 mm thick CBGA module (representing a 37% reduction from the initial height of 35 mils), and from 25.5 mils to about 23.5 mils for the 1.5 mm CBGA module (representing a 33% reduction from the initial height of 35 mils).

Cases #2 and #3 are single-melt cases in which the solder ball 16 and the joiner solder 22 melt at the same temperature, since the solder ball 16 and the joiner solder 22 contain the same alloy for each of Cases #2 and #3. Case #2 uses the eutectic 63Sn/37Pb alloy with melting temperature 183° C., and Case #3 uses the 95.5Sn/3.8Ag/0.7Cu alloy with melting temperature 217° C. The electronic structure 10 for Case #2 has a thermal fatigue life ($TFL_2$) that is only 38% and 35% of the reference $TFL_1$ for CBGA module thicknesses 1.5 mm and 2.9 mm, respectively. The electronic structure 10 for Case #3 has a thermal fatigue life ($TFL_3$) that is only 76% and 69% of the reference $TFL_1$ for CBGA module thicknesses 1.5 mm and 2.9 mm, respectively. The aforementioned $TFL_2$ and $TFL_3$ variation with respect to the CBGA module thickness is purely statistical and is without substantive significance.

Case #4 is a dual-melt case, wherein the solder ball 16 includes 95Sn/5Sb and the joiner solder 22 includes the 95.5Sn/3.8Ag/0.7Cu alloy with liquidus temperature 217° C. In sharp contrast with Cases #2 and #3, Case #4 has a thermal fatigue life ($TFL_4$) that is 90% and 93% of the reference $TFL_1$ for CBGA module thicknesses 1.5 mm and 2.9 mm, respectively. As with Cases #2 and #3, the aforementioned $TFL_4$ variation with respect to the CBGA module thickness is purely statistical and is without substantive significance. Case #4 shows the thermal fatigue life $TFL_4$ as nearly equal to the reference $TFL_1$ even though the solder ball 16 melted both during CBGA module fabrication (see FIG. 2) and circuit card assembly (see FIG. 3) resulting in the total height being reduced from the initial height $H_0$ of 35 mils to a final height H in a range of about 22 mils to about 23.5 mils. If the solder ball 16 does not melt a second time (i.e., during reflow of the joiner solder 22) for Case #4, such as by reflowing the joiner solder 22 below 234° C., or by other techniques such as by using 90Sn/10Sb alloy in the solder ball 16 with reflow of the joiner solder 22 occurring below 245° C., then $TFL_4$ would be expected to exceed the aforementioned 0.90–0.93 values. Nonetheless, the $TFL_4$ results of Case #4, which exemplifies embodiments of the present invention, are acceptable regardless of whether or not the solder ball 16 melts during reflow of the joiner solder 22; i.e., at least 90–93% of the reference thermal fatigue life $TFL_1$ is retained in Case #4. This is an unexpected beneficial result in light of the total height reduction of 33%–37% from the initial height of 35 mils of the solder ball 16.

If TFL were to be expressed in absolute terms (i.e., in terms of number of cycles to failure of the electronic structure 10) instead of as normalized, then the thicker CBGA module thickness of 2.9 mils would show a lower TFL than would the thinner CBGA module thickness of 1.5 mils, because the higher CBGA module thickness makes the module stiffer and thus less resistive to shear stress than is a thinner, more flexible CBGA module. Nonetheless, Table 2 shows that the TFL, when expressed in the normalized format, is insensitive to CBGA module thickness. Hence, the beneficial use of Case #4 for embodiments of the present invention, in contrast with other solder compositions, does not depend on the CBGA module thickness.

As stated supra, the solder ball 16 does not melt during reflow of the joiner solder 22 if the reflow temperature is below the solidus temperature of the solder ball 16. If the reflow temperature exceeds the solidus temperature of the solder ball 16 but is less than the liquidus temperature of the solder ball 16, then partial melting of the solder ball 16 will occur during the reflow. If the reflow temperature exceeds the liquidus temperature of the solder ball 16, then the solder ball 16 will completely melt during the reflow, and additionally the liquified material of the solder ball 16 may intermix with the material of the joiner solder 22 as shown in FIG. 4.

Figure 4:
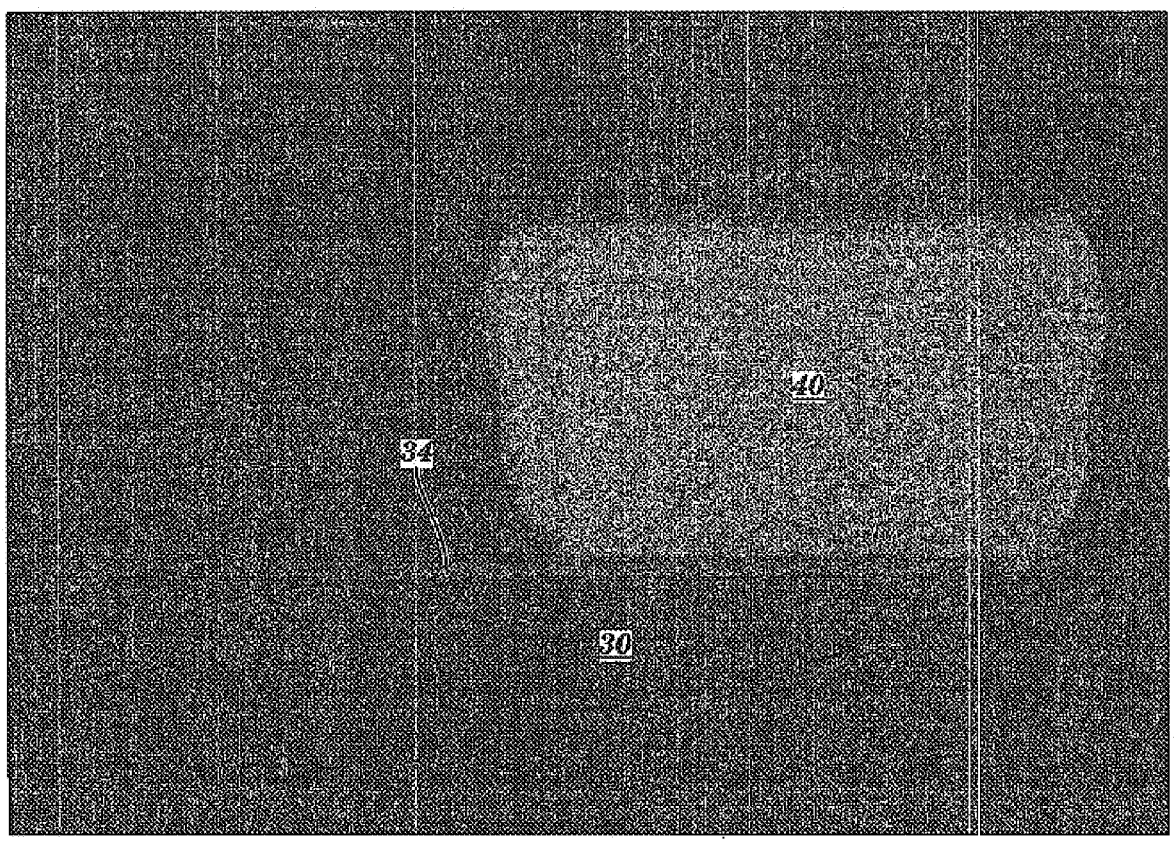
FIG. 4 depicts an image of an intermixing of material of the solder ball of FIG. 3 with material of the joiner solder of FIG. 3.

FIG. 4 illustrates an image 40 of an intermixing of material of the solder ball 16 of FIG. 3 with material of the joiner solder 22 of FIG. 3 for Case #4 of Table 2. The image 40 is on the conductive pad 34 of the circuit board 30. In the image 40 in FIG. 4, there is no visual differentiation of solder ball 16 material from joiner solder 22 material, which demonstrates intermixing of solder ball 16 material with joiner solder 22 material. Such intermixing is made possible by melting of the solder ball 16 during reflow of the joiner solder 22. Conversely, if the solder ball 16 does not melt during reflow of the joiner solder 22, then there is no intermixing of solder ball 16 material and joiner solder 22 material.

This disclosure has demonstrated the usefulness of the lead-free solder ball 16 and the lead-free joiner solder 22 of the present invention. Although the lead-free solder ball 16 was described herein as comprising a tin-antimony alloy, the lead-free solder ball 16 may also includes small or trace amounts of other metals such as, inter alia, copper, bismuth, zinc, silver, and nickel.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

While the solder ball 16 appearing in FIGS. 1–3 is labeled as a solder ball, the solder ball 16 may have any geometrical shape that is compatible with solderably coupling the solder ball 16 to the electronic module 12 and to the circuit card 30 as described herein. Thus, the solder ball 16 generally includes a solder member having, inter alia, a solder ball (i.e., approximately spherical) shape, a solder column (i.e., approximately cylindrical) shape, etc.

While the electronic module 12 and the circuit card 30 in FIGS. 1–3 are labeled as an electronic module and a circuit card, respectively, the electronic module 12 is generally a first substrate (e.g., inter alia, an electronic module such as a CBGA or PBGA module, a semiconductor chip, etc.) and the circuit card 30 is generally a second substrate (e.g., inter alia, a circuit card, ceramic multichip substrate, etc.

We claim:

1. A method for forming an electronic structure, comprising the steps of:

providing a substrate; and soldering a lead-free solder member to the substrate without using a joining solder to effectuate the soldering, wherein the solder member consists essentially of a tin-antimony alloy, and wherein the tin-antimony alloy consists of about 3% to about 15% antimony by weight and a remainder consisting essentially of tin by weight.

2. The method of claim 1, wherein the tin-antimony alloy includes about 5% to about 10% antimony by weight.

3. The method of claim 1, wherein the soldering step includes reflowing the solder member.

4. The method of claim 1, wherein the soldering step reduces a height of the solder member between about 25% and about 30%.

5. The method of claim 1, wherein the substrate includes a ceramic ball grid array (CBGA) module or a plastic ball grid array (PBGA) module.

6. The method of claim 1, wherein the substrate includes a semiconductor chip.

7. The method of claim 1, wherein the solder member is a solder ball.

8. The method of claim 1, wherein the tin-antimony alloy includes more than 10% antimony by weight.

9. A method for forming an electronic structure, comprising the steps of:

providing a first substrata and a second substrate;

soldering a lead-free solder member to the first substrate without using a joining solder to effectuate the soldering, wherein the solder member consists essentially of a tin-antimony alloy, and wherein the tin-antimony alloy consists of about 3% to about 15% antimony by weight and a remainder consisting essentially of tin by weight; and soldering the solder member to the second substrate with a lead-free joiner solder.

10. The method of claim 9, wherein the tin-antimony alloy includes about 5% to about 10% antimony by weight.

11. The method of claim 9, wherein the step of soldering the solder member to the second substrate includes reflowing the joiner solder at a temperature above a liquidus temperature of the joiner solder and below a highest temperature which will not damage any portion of the electronic structure.

12. The method of claim 9, wherein the step of soldering the solder member to the second substrate includes reflowing the joiner solder at a temperature above a liquidus temperature of the joiner solder and below about 250° C.

13. The method of claim 9, wherein the joiner solder consists essentially of a tin-silver-copper alloy, wherein the tin-silver-copper alloy consists essentially of by weight about 95.5–96.0% tin, about 3.5–4.0% silver, and about 0.5–1.0% copper.

14. The method of claim 13, wherein the step of soldering the solder member to the second substrate includes reflowing the joiner solder at a temperature between about 230° C. and about 250° C.

15. The method of claim 9, wherein the step of soldering the solder member to the second substrate includes melting the solder member.

16. The method of claim 15, wherein the step of soldering the solder member to the second substrate includes intermixing the tin-antimony alloy with the joiner solder.

17. The method of claim 9, wherein the step of soldering the solder member to the second substrate does not include melting the solder member.

18. The method of claim 17, wherein the step of soldering the solder member to the second substrate does not include intermixing the tin-antimony alloy with the joiner solder.

19. The method of claim 9, wherein the first substrate includes a ceramic ball grid array (CBGA) module or a plastic ball grid array (PBGA) module.

20. The method of claim 9, wherein the first substrate includes a semiconductor chip.

21. The method of claim 9, wherein the solder member is a solder ball.

22. An electronic structure, comprising:

a substrate;

a lead-free solder member soldered to the substrate with no joining solder between the solder member and the substrate, wherein the solder member consists essentially of a tin-antimony alloy, and wherein the tin-antimony alloy consists of about 3% to about 15% antimony by weight and a remainder consisting essentially of tin by weight.

23. The electronic structure of claim 22, wherein the tin-antimony alloy includes about 5% to about 10% antimony by weight.

24. The electronic structure of claim 22, wherein the substrate includes a ceramic ball grid array (CBGA) module or a plastic ball grid array (PBGA) module.

25. The electronic structure of claim 22, wherein the substrata includes a semiconductor chip.

26. The method of claim 22, wherein the solder member is a solder ball.

27. The method of claim 22, wherein the tin-antimony alloy includes more than 10% antimony by weight.

28. An electronic structure, comprising:

a first substrate;

a second substrate; and a lead-free solder member soldered to the first substrate with no joining solder between the solder member and the first substrate, wherein the solder member is soldered to the second substrate with a load-free joiner solder, wherein the solder member consists essentially of a tin-antimony alloy, and wherein the tin-antimony alloy consists of about 3% to about 15% antimony by weight and a remainder consisting essentially of tin by weight.

29. The electronic structure of claim 28, wherein the tin-antimony alloy includes about 5% to about 10% antimony by weight.

30. The electronic structure of claim 28, wherein the tin-antimony alloy is intermixed with the joiner solder.

31. The electronic structure of claim 28, wherein the tin-antimony alloy is not intermixed with the joiner solder.

32. The electronic structure of claim 28, wherein the joiner solder consists essentially of a tin-silver-copper alloy, wherein the tin-silver-copper alloy consists essentially of by weight about 95.5–96.0% tin, about 3.5–4.0% silver, and about 0.5–1.0% copper.

33. The electronic structure of claim 28, wherein the first substrate includes a ceramic ball grid array (CBGA) module or a plastic ball grid array (PBGA) module.

34. The electronic structure of claim 28, wherein the first substrate includes a semiconductor chip.

35. The method of claim 28, wherein the solder member is a solder ball.

* * * * *